(12) United States Patent
Gajjewar et al.

(10) Patent No.: US 7,924,638 B2
(45) Date of Patent: Apr. 12, 2011

(54) REDUNDANCY ARCHITECTURE FOR AN INTEGRATED CIRCUIT MEMORY

(75) Inventors: Hemangi Umakant Gajjewar, Santa Clara, CA (US); Karl Lin Wang, Los Altos, CA (US)

(73) Assignee: ARM Limited, Cambridge (GB)

( * ) Notice: Subject to any disclaimer, the term of this patent is extended or adjusted under 35 U.S.C. 154(b) by 997 days.

(21) Appl. No.: 11/785,583

(22) Filed: Apr. 18, 2007

(65) Prior Publication Data

US 2008/0259701 A1 Oct. 23, 2008

(51) Int. Cl.
*G11C 7/00* (2006.01)
(52) U.S. Cl. ............... 365/200; 365/195; 365/225.7
(58) Field of Classification Search .......... 365/200, 365/195, 230.03, 189.08, 189.06
See application file for complete search history.

(56) References Cited

U.S. PATENT DOCUMENTS

| | | | | |
|---|---|---|---|---|
| 6,297,997 B1* | 10/2001 | Ohtani et al. | ............... | 365/201 |
| 6,320,801 B1* | 11/2001 | Kwak | ............... | 365/200 |
| 7,420,859 B2* | 9/2008 | Nautiyal | ............... | 365/200 |
| 7,495,976 B2* | 2/2009 | Mittal et al. | ............... | 365/200 |
| 2008/0266990 A1* | 10/2008 | Loeffler | ............... | 365/201 |
| 2009/0168569 A1* | 7/2009 | Ryu | ............... | 365/200 |

* cited by examiner

*Primary Examiner* — Richard Elms
*Assistant Examiner* — Hien N Nguyen
(74) *Attorney, Agent, or Firm* — Nixon & Vanderhye P.C.

(57) ABSTRACT

An integrated circuit memory is described having multiple memory banks which are grouped into repair groups Group0, Group1. One of the memory banks is provided with redundant rows which can be used to substitute for a defective row found within any of the memory banks within the common repair group concerned. Redundant columns of memory cells are also provided and these may be substituted for defective columns by multiplexing circuitry. This multiplexing circuitry shifts the bit lines which are selected to form part of a bit group to access a given data bit by an amount less than the multiplexing width being supported by that multiplexing circuitry thereby reducing the number of redundant columns which need be provided.

27 Claims, 6 Drawing Sheets

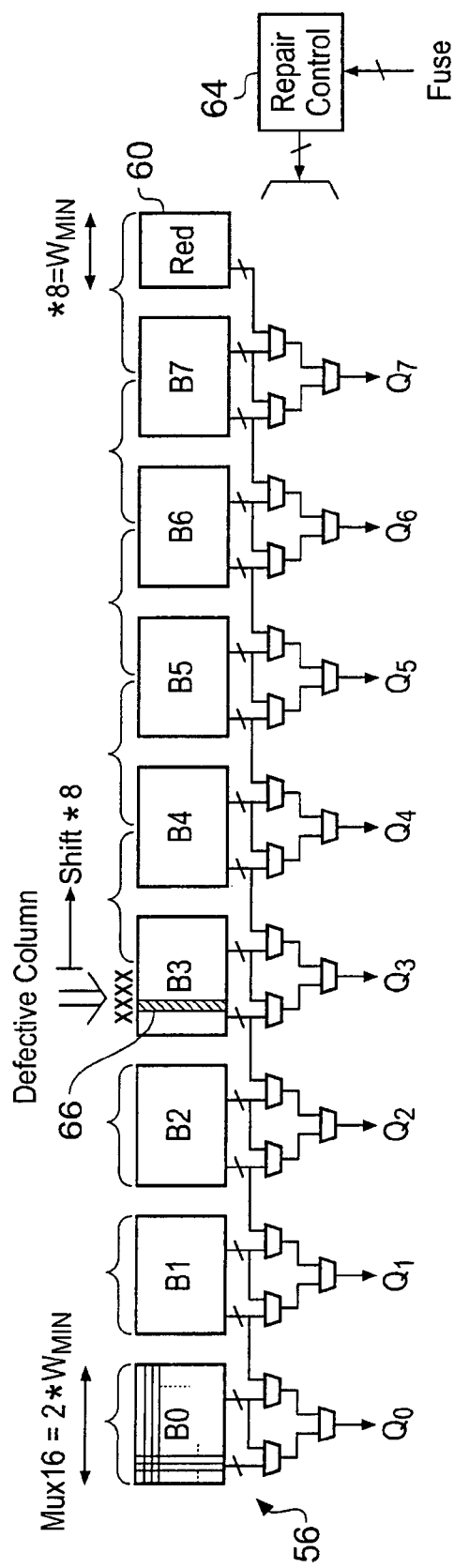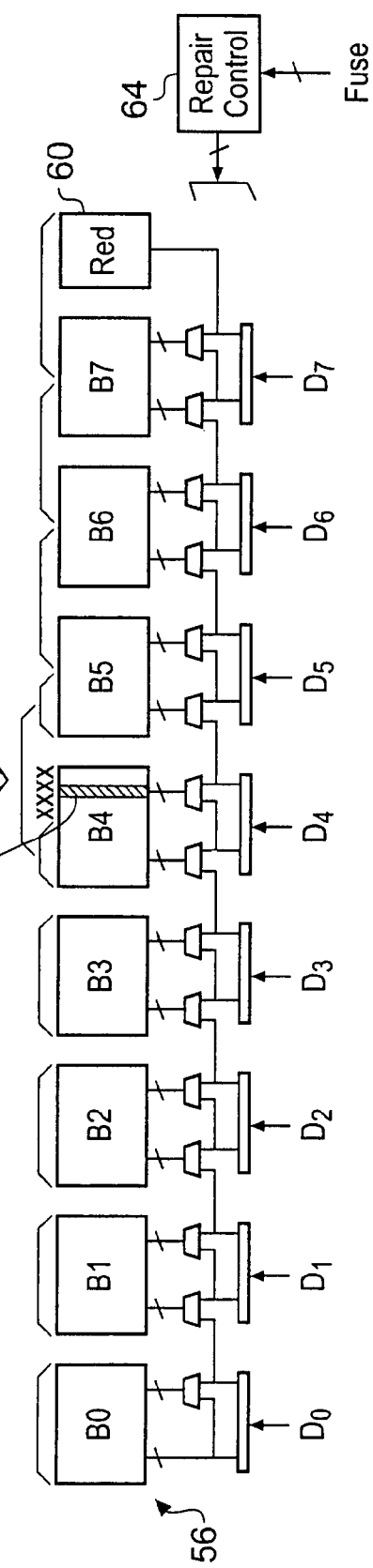
Fig. 6
Fig. 7

REDUNDANCY ARCHITECTURE FOR AN INTEGRATED CIRCUIT MEMORY

TECHNICAL FIELD

This technology described in this application relates to integrated circuit memories, and particularly, to row and column redundancy architectures for use within integrated circuit memories.

BACKGROUND

It is known within the field of integrated circuit memories to provide redundant memory rows and redundant memory columns within arrays of memory cells. In this way, should a defect arise which renders a row inoperative or a column inoperative, then one of the redundant rows or column may be functionally substituted for the row or column in which the defect has arisen. This type of redundancy mechanism is becoming increasingly important as process geometries scale to smaller sizes and defects within integrated circuits become statistically more likely. In this context, such redundancy mechanisms are important in maintaining a satisfactory yield.

A problem with redundancy architectures is that they represent an additional overhead in terms of circuit area, power consumption, complexity, and timing which has to be carried by every integrated circuit irrespective of whether or not the redundancy mechanisms for that integrated circuit are needed within the particular instance. For this reason, it is desirable to reduce the overheads associated with such redundancy mechanisms, whilst preserving their ability to maintain a satisfactory yield of properly functioning integrated circuits.

One known form of row redundancy mechanism is to provide redundant rows in each memory bank, each memory bank comprising an array of memory cells. The redundant rows within each memory bank can serve as a functional replacement for any defective rows within that memory bank. It is difficult to decide the number of redundant rows which should be provided in each memory bank. If the number is too small, then there may be insufficient redundant rows to repair all the defective rows which occur within a particular memory bank. This is particularly the case as errors tend to cluster together. However, if too many redundant rows are provided in each memory bank, then this represents an unnecessarily high overhead. Another known approach is to provide a complete bank of redundant rows which can be substituted in place of any of the rows within other banks which may be found to be defective. This approach suffers from the disadvantage that the separate bank of redundant rows has to be provided with its own decoders and other support circuitry and this represents a disadvantageous additional overhead.

As previously discussed, an integrated circuit memory can also suffer from defective columns of memory cells. In order to address this problem it is known to provide redundant columns of memory cells and multiplexers which serve to select the group of columns from which a particular bit of data is to be drawn in dependence upon the memory address with these multiplexers being double the normal multiplexer width such that either an original group of bit lines may be selected or an alternative shifted group of bit lines selected if the original contains a defective column. In this way, the columns of memory cells being utilized to store a given bit to one side of a defective column are all shifted to the side by the multiplexer width being employed within the group of columns. The provision of a full multiplexer width group of columns that can be used as a substitute when a defective column is encountered is disadvantageous in terms of the circuit overhead consumed.

SUMMARY

Viewed from one aspect the technology described in this application provides an integrated circuit memory comprising:

a plurality of memory banks forming a repair group of memory banks, each of said plurality of memory banks having an array of memory cells and a plurality of bit lines coupled to respective columns of memory cells and not shared with any other memory bank; wherein at least one of said plurality of memory banks includes at least one redundant row of memory cells and at least one non-redundant row of memory cells; and further comprising:

redundant row control circuitry coupled to said plurality of memory banks and responsive to input memory address signals addressing a defective row of memory cells within any memory bank within said repair group to substitute one of said at least one redundant rows of memory cells for said defective row of memory cells.

This technology provides a plurality of memory banks forming a repair group (which may encompass all of the memory banks on an integrated circuit or only some of the memory banks on an integrated circuit) with at least one of those memory banks including at least one redundant row of memory cells. The row controller is arranged such that the redundant row within the at least one memory bank can substitute for a defective row within any of the other memory banks within that repair group. Thus, the provision of a dedicated memory bank of redundant rows is avoided and overhead accordingly reduced whilst providing the flexibility that the redundant rows provided may be used to substitute for defective rows in memory banks other than the one in which they are formed thereby increasing the flexibility with which the redundant rows can be utilized and reducing the number of redundant rows which need to be provided in any one memory bank. A given memory bank may be subject to a relatively large number of defective rows and yet these can be substituted for by redundant rows both within the memory bank concerned and from within other memory banks within the integrated circuit.

Whilst it will be appreciated that the integrated circuit could comprise a single repair group, preferred embodiments utilize a plurality of repair groups as this makes signal routing for the signals necessary to control the substitution more convenient whilst enabling redundant row resources to be shared amongst memory banks of a given repair group.

It will be appreciated that it would be possible for each of the memory banks to contain some redundant rows with sharing of the redundant rows being possible between all of the memory banks in the repair group. As an alternative, since redundant rows can be shared between memory banks, it is possible for some of the memory banks not to contain any redundant rows thus providing higher storage capacity/lower area.

One particular arrangement is where a repair group contains a single memory bank having at least one redundant row of memory cells and at least one non-redundant row of memory cells with the other memory banks within that repair group not containing any redundant rows of memory cells.

The rows of memory cells can be accessed using word lines carrying word line signals generated by an address decoder. In this context, the redundant row control circuitry can be coupled to the address decoder to inhibit generation of a word line signal for a defective row of memory cells and to substitute generation of a word line signal for a redundant row of memory cells.

The redundant row control circuitry may be incorporated within the memory instance(s) itself and can comprise address matching circuitry for comparing an input row address with a detective row address (e.g. from fusible links) to generate a redundant row enable signal.

There are different ways in which the redundant row enable signal (or signals) can be used to control the way in which the redundant row substitutes for the defective row. In a first scenario where the defective row is in a separate memory bank to the redundant row, both may be accessed and coupled to their bit lines and then the redundant row enable signal used to disable the read of the defective row, preferably by disabling the sense amplifiers coupled to the bit lines reading the defective row.

In a different scenario in which the redundant row is in the same memory bank as the defective row, then the redundant row enable signal is used to disable the word line associated with the defective row whilst the word line associated with the redundant row remains enabled. This type of control is facilitated when the address matching circuit is proximal to the memory bank containing the redundant row of memory cells and the defective row of memory cells which are to be controlled as in this way as the disabling of the word line of the defective row of memory cells can then be achieved rapidly.

Whilst it will be appreciated that the memory banks can be laid out in a variety of different ways in accordance with the present techniques, a particularly preferred way is one in which adjacent memory banks belong to different repair groups. A further refinement is where the plurality of memory banks comprise two sections of memory banks with each section of memory banks comprising two repair groups. The memory banks within such an arrangement which are to contain the redundant rows and memory cells are at a position within their repair group closest to the end of such an array of memory banks.

Viewed from another aspect the technology described in this application provides an integrated circuit memory comprising:

a plurality of memory bank means forming a repair group of memory bank means, each of said plurality of memory bank means having an array of memory cell means and a plurality of bit lines coupled to respective columns of memory cell means and not shared with any other memory bank means; wherein at least one of said plurality of memory bank means includes at least one redundant row of memory cell means and at least one non-redundant row of memory cell means; and further comprising:

redundant row control means coupled to said plurality of memory bank means and responsive to input memory address signals addressing a defective row of memory cell means within any memory bank means within said repair group for substituting one of said at least one redundant rows of memory cell means for said defective row of memory cell means.

Viewed from a further aspect the technology described in this application provides a method of operating an integrated circuit memory having a plurality of memory banks forming a repair group of memory banks, each of said plurality of memory banks having an array of memory cells and a plurality of bit lines coupled to respective columns of memory cells and not shared with any other memory bank, at least one of said plurality of memory banks includes at least one redundant row of memory cells and at least one non-redundant row of memory cells; said method comprising the step of:

in response to input memory address signals addressing a defective row of memory cells within any memory bank within said repair group, substituting one of said at least one redundant rows of memory cells for said defective row of memory cells.

Viewed from another aspect the technology described in this application provides an integrated circuit memory comprising:

an array of memory cells having a plurality of columns of memory cells, including at least one redundant column of memory cells, and a plurality of bit lines, each of said plurality of bit lines being coupled to one of said columns;

multiplexing circuitry coupled to said plurality of bit lines to group said plurality of bit lines into bit groups having a multiplexer width number of bit lines and responsive to an input memory address to select a bit line from each bit group to carry a signal for a corresponding data bit within a data word to be accesses;

redundant column control circuitry coupled to said multiplexing circuitry and responsive to a defect signal indicative of a location of a defective column of memory cells within said array of memory cells to control said multiplexing circuitry to select said bit lines to form said bit groups such that:

a set of bit lines forming a bit group that would otherwise include a bit line of said defective column instead includes one or more bit lines to one side of said defective column toward said at least one redundant column and taken from positions shifted by a shift number of bit lines, said defective column thereby being omitted from said set of bit lines and said shift number being less than said multiplexer size number;

any other bit group to said one side comprises a selection of bit lines correspondingly shifted by said shift number compared to when said defective column is not present; and at least one of said bit groups extending to said one side includes at least one of said at least one redundant columns.

The inventors recognized that the shift in the number of columns to avoid a defective column does not need to be a shift corresponding to the full multiplexer size of the memory concerned. In this way, fewer redundant columns need be provided. This is a significant advantage as multiplexer width can be high, e.g. 16 or 32 bit multiplexers are common, and accordingly a large number of redundant columns would otherwise be necessary to overcome what is normally a defect within only a single column.

The redundant columns are conveniently disposed at one edge of the array of memory cells such that the shifting is toward this edge. When the integrated circuit comprises two memory arrays disposed either side of an address decoder, then each of these can include at least one redundant column and respective multiplexing circuitry such that a defective column is substituted by a redundant column from within its own memory array without having to traverse the intervening address decoder.

A frequently used way of forming integrated circuits is to use unit cell circuits which are built up into the entire integrated circuit. In this context, there is typically a minimum width of memory cells within the unit cell circuits and the multiplexer width number will be a multiple of this cell width with the main advantage of the current technique arising when this multiple is greater than two. It is convenient for the shift number to be the minimum width of memory cells within the unit circuit as this reduces the number of redundant columns which need be provided.

Viewed from a further aspect the technology described in this application provides an integrated circuit memory comprising:

an array of memory cell means having a plurality of columns of memory cell means, including at least one redundant column of memory cell means, and a plurality of bit lines, each of said plurality of bit lines being coupled to one of said columns;

multiplexing means coupled to said plurality of bit lines for grouping said plurality of bit lines into bit groups having a multiplexer width number of bit lines and, in response to an input memory address, for selecting a bit line from each bit group to carry a signal for a corresponding data bit within a data word to be accesses;

redundant column control means coupled to said multiplexing circuitry and responsive to a defect signal indicative of a location of a defective column of memory cells within said array of memory cells for controlling said multiplexing means to select said bit lines to form said bit groups such that:

a set of bit lines forming a bit group that would otherwise include a bit line of said defective column instead includes one or more bit lines to one side of said defective column toward said at least one redundant column and taken from positions shifted by a shift number of bit lines, said defective column thereby being omitted from said set of bit lines and said shift number being less than said multiplexer size number;

any other bit group to said one side comprises a selection of bit lines correspondingly shifted by said shift number compared to when said defective column is not present; and at least one of said bit groups extending to said one side includes at least one of said at least one redundant columns.

Viewed from a further aspect the technology described in this application provides a method of operating an integrated circuit memory having an array of memory cells containing a plurality of columns of memory cells, including at least one redundant column of memory cells, and a plurality of bit lines, each of said plurality of bit lines being coupled to one of said columns, said method comprising the steps of:

grouping said plurality of bit lines into bit groups having a multiplexer width number of bit lines;

in response to an input memory address, selecting a bit line from each bit group to carry a signal for a corresponding data bit within a data word to be accesses;

in response to a defect signal indicative of a location of a defective column of memory cells within said array of memory cells controlling said step of selecting said bit lines to form said bit groups such that:

a set of bit lines forming a bit group that would otherwise include a bit line of said defective column instead includes one or more bit lines to one side of said defective column toward said at least one redundant column and taken from positions shifted by a shift number of bit lines, said defective column thereby being omitted from said set of bit lines and said shift number being less than said multiplexer size number;

any other bit group to said one side comprises a selection of bit lines correspondingly shifted by said shift number compared to when said defective column is not present; and at least one of said bit groups extending to said one side includes at least one of said at least one redundant columns.

The above, and other objects, features and advantages will be apparent from the following detailed description of illustrative embodiments which is to be read in connection with the accompanying drawings.

BRIEF DESCRIPTION OF THE DRAWINGS

FIGS. 6 and 7 respectively illustrate the multiplexer circuits associated with data read and data write operations when utilizing column redundancy in accordance with the present techniques.

DESCRIPTION

Figure 1:
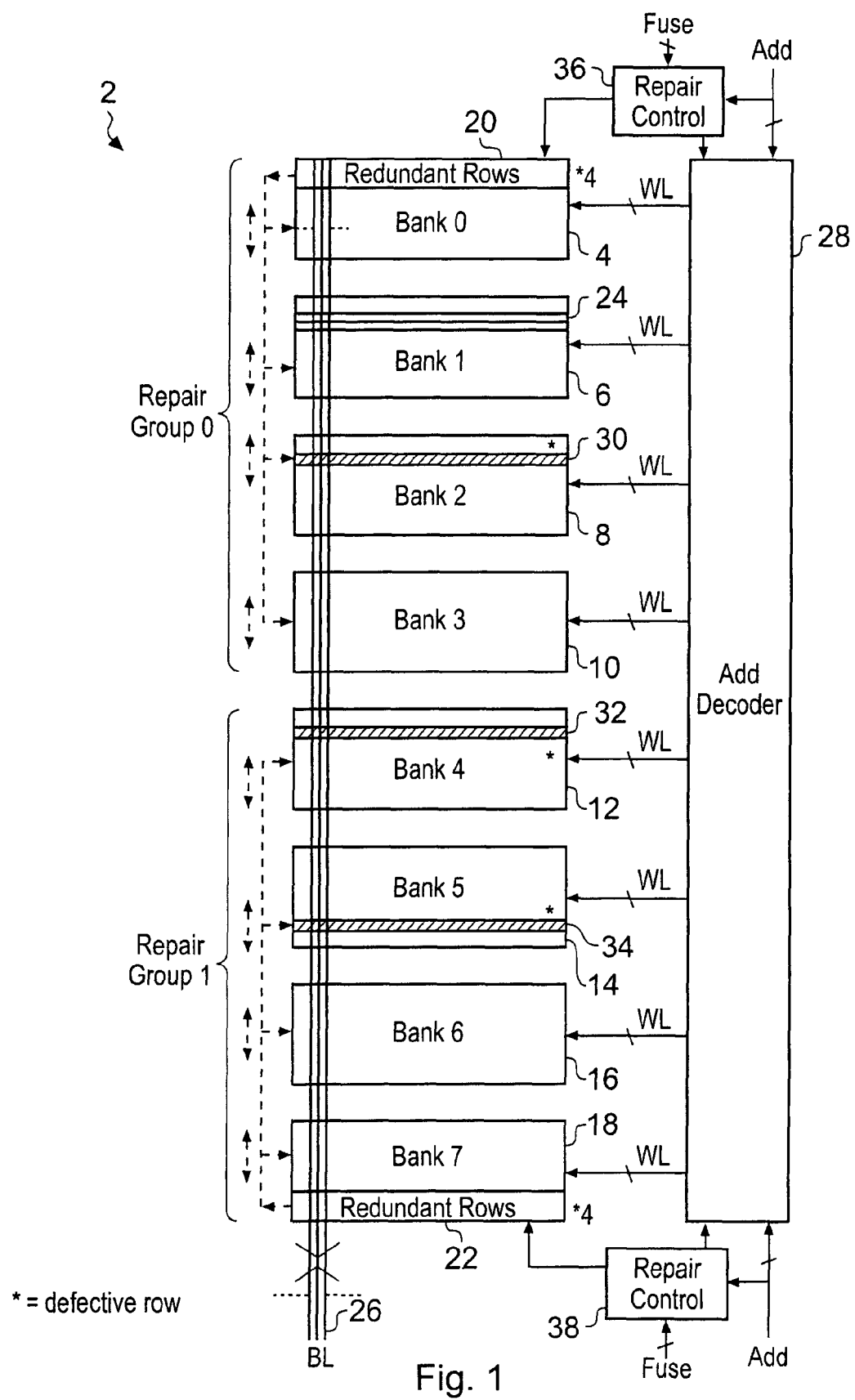
FIG. 1 schematically illustrates an integrated circuit comprising a plurality of memory banks arranged into a plurality of repair groups with some of the memory banks including redundant rows.

FIG. 1 schematically illustrates an integrated circuit memory 2 comprising a plurality of memory banks 4, 6, 8, 10, 12, 14, 16, 18. These memory banks 4-18 are arranged into two repair groups. The first repair group Group0 comprises memory banks 4, 6, 8, 10. The second repair group Group1 comprises memory banks 12, 14, 16, 18.

As illustrated in FIG. 1, within each of these repair groups only one of the memory banks (either memory bank 4 or memory bank 18) contains any redundant rows 20, 22. Four redundant rows are provided within memory bank 4. Four redundant rows are provided in memory bank 18. The four redundant rows 20 within the memory bank 4 may act to substitute for any of the rows of memory cells 24 within any of the memory banks 4, 6, 8, 10 which constitute Group0. It will be appreciated that each of the rows of memory cells 24 comprises a plurality of memory cells each storing one bit of data and linked to bit lines 26 via which data is read from or written to those memory cells. The bit lines 26 are shared by the memory banks 4-18 within each repair group and between repair groups.

An address decoder 28 is responsive to input address signals specifying a memory address to be accessed. The address decoder 28 decodes these input address signals to assert a hit signal on a corresponding word line WL supplied to the rows of memory cells to be accessed. When a row of memory cells 24 is selected by an asserted word line signal, the individual memory cells within that row are coupled to the bit lines 26 for reading data from the memory cells or writing data to the memory cells. This form of memory bank accessing is known in this field and will not be described further.

As illustrated in FIG. 1, the integrated circuit memory 2 contains a number of defective rows of memory cells which have been marked with an "*". In order that the integrated circuit memory 2 should function properly, the bits of data which should have been stored within these defective rows need to be stored elsewhere. For this purpose, the defective row 30 is located within Group0 and accordingly one of the redundant rows 20 taken from the memory bank 4 is used to substitute for the defective row 30. In a similar way, defective rows 32 and 34 are located within memory banks 12 and 14 and within Group1 and accordingly are substitute for by redundant rows 22 taken from memory bank 18. The substituting of redundant rows 20, 22 for defective rows 30, 32, 34 is controlled by respective redundant row control circuitry 36, 38 associated with Group0 and Group1. When the integrated circuit memory 2 is first tested after manufacture, it is determined which rows of memory cells 24 are defective rows of memory cells 30, 32, 34 and this information encoded by way of fuse signals (e.g. fuse signal registers) which are supplied to the redundant row control circuitry during operation of the integrated circuit memory. When a memory address is received by the address decoder 28 which corresponds to a defective row 30, 32, 34 falling under the responsibility of a respective one of the redundant row control circuits 36, 38, then this is recognized by a match against the fuse signals and the word line signal WL for that defective row in inhibited and instead replaced by a word line signal WL to one of the redundant rows 20, 22.

It will be seen that within each repair group Group0, Group1 only one of the memory banks 4, 18 contains any redundant rows. The other memory banks 6, 8, 10 and 12, 14, 16 need not contain redundant rows and accordingly have either a higher storage capacity or a lower circuit area.

Figure 2:
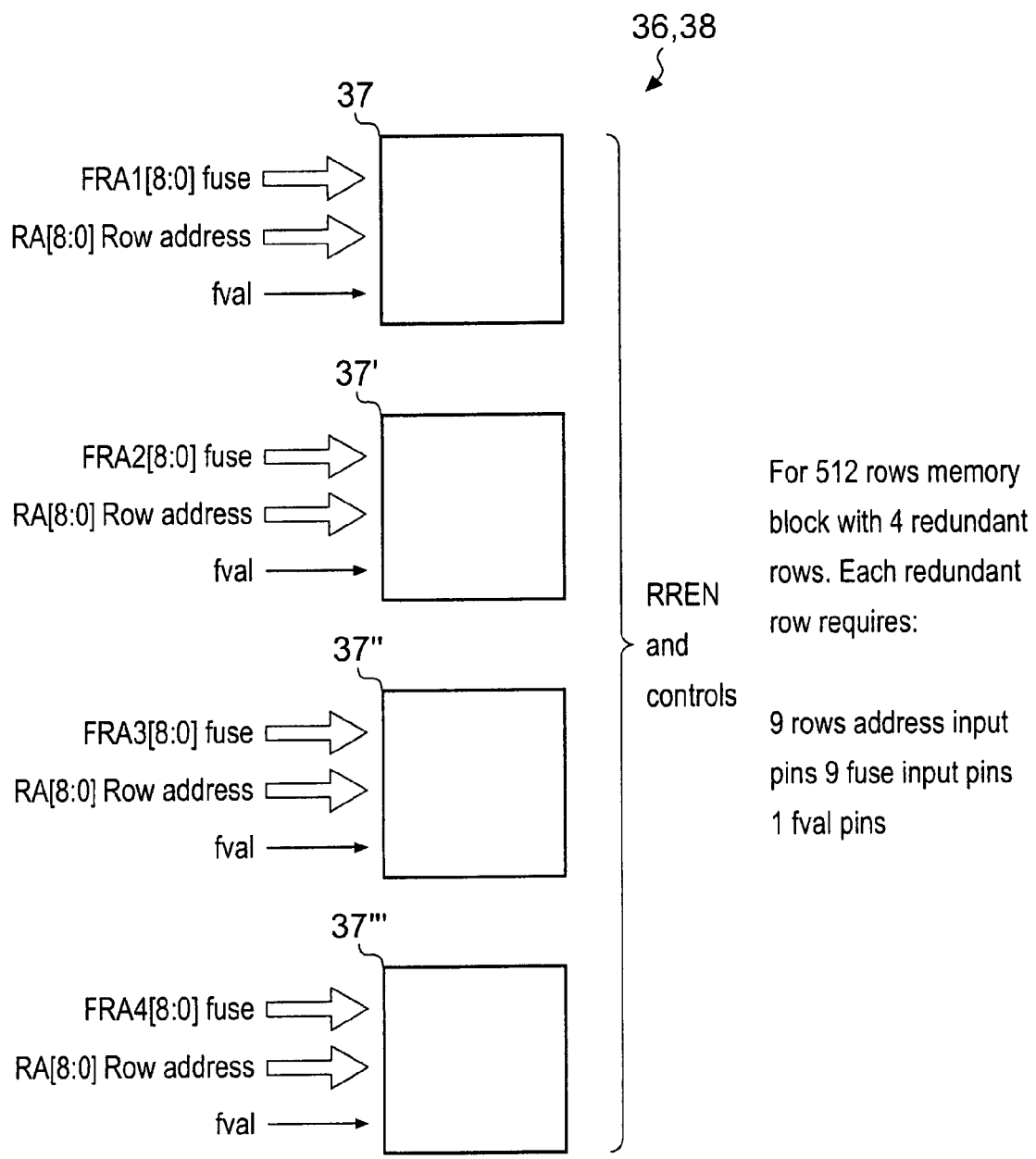
FIG. 2 schematically illustrates a portion of the redundant row control circuitry.

FIG. 2 schematically illustrates a portion of the redundant row control circuitry 36, 38 provided within each memory instance to improve address setup time considerations. The redundant row control circuitry includes address matching circuitry (block) 37, 37', 37" and 37'" for each redundant row provided. Each of these blocks receives a predetermined address FRAn [8:0] specified by fusible links that are programmed to represent the row addresses of any detective row found during test. This predetermined address FRAn [8:0] is compared with an input row address and if a match occurs then a redundant row enable signal RREN is generated to enable access to the redundant row to be used in place of the defective row. Not all of the address matching circuitry 37, 37', 37" and 37'" need be active dependent upon the number of defective rows present and this can be controlled using an active signal fval indicating with a corresponding fuse address FRAn [8:0] is active in representing a defective row.

Figure 3:
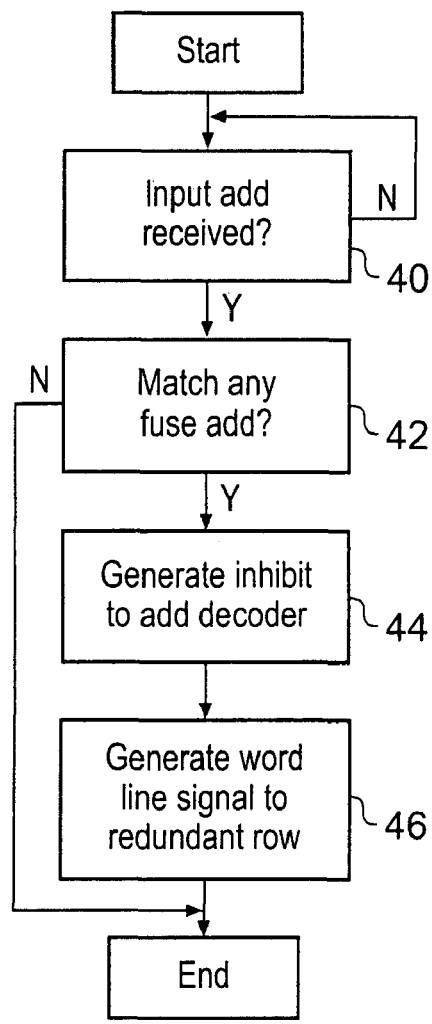
FIG. 3 schematically illustrates the behaviour of repair control circuitry in substituting a redundant row for a defective row.

FIG. 3 is a flow diagram schematically illustrating the action of the redundant row repair control circuitry 36, 38 (this is necessarily sequential, but it will be appreciated that circuit implementations may perform at least some steps in parallel or in a different order). At step 40 processing waits until an input address is received. At step 42 a determination is made as to whether or not the input address matches any fuse address which has been programmed as corresponding to a defective row 30, 32, 34. If there is no such match, then processing terminates. If there is a match at step 42, then step 44 serves to generate an inhibit operation for the address decoder 28 to inhibit generation of the word line signal WL which would otherwise drive the defective row 30, 32, 34 to be accessed by coupling it to be the bit lines 26. At step 46, the repair control circuitry 36, 38 instead generates a word line signal WL to one of the redundant rows 20, 22 for the relevant repair group.

Figure 4:
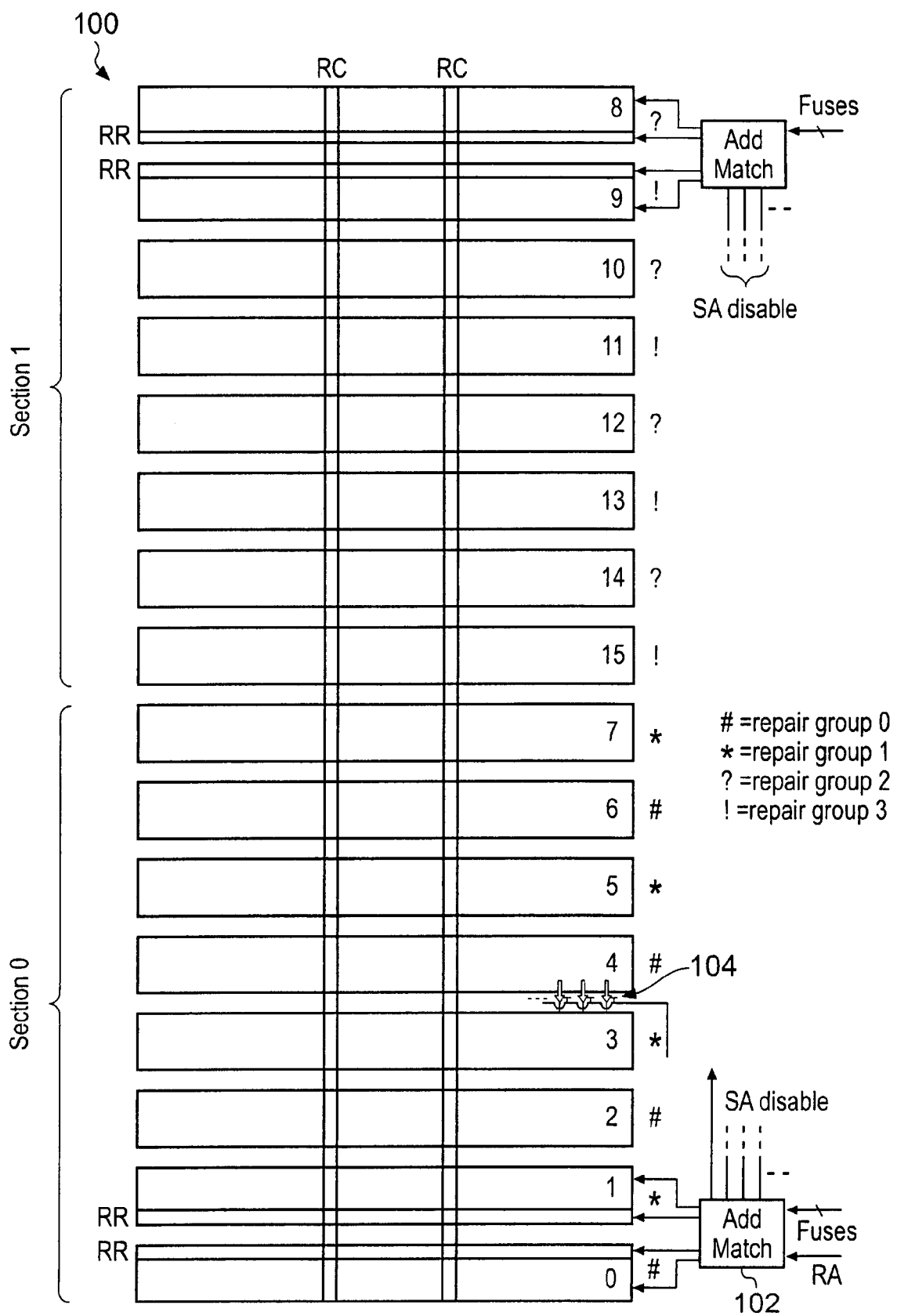
FIG. 4 schematically illustrates another example arrangement of the provision and control of redundant rows of memory cells.

FIG. 4 schematically illustrates another example arrangement of the provision and control of redundant rows of memory cells within an integrated circuit memory. In this example the integrated circuit memory 100 comprises sixteen memory banks each formed of an array of memory cells comprising a plurality of rows of memory cells and a plurality of columns of memory cells. Bit lines run through the arrays of memory cells for accessing the data stored within the memory cells and word lines run across the memory banks for selecting rows of memory cells to be accessed. This is conventional and will be familiar to those in this technical field.

The sixteen memory banks are split into two sections namely section 0 comprising memory banks 0-7, and section 1 comprising memory banks 8-15. The memory banks 0-15 are disposed as a one-dimensional array, i.e. laid out in a line, and, as illustrated in FIG. 4, redundant columns of memory cells RC are provided as will be discussed later. Each section of memory banks itself comprises two repair groups. Section 0 contains repair group 0 comprising memory banks 0, 2, 4 and 6, and repair group 1 comprising memory banks 1, 3, 5 and 7. Within each of these repair groups only one of the memory banks contains the redundant rows RR which will be used to substitute for defective rows found within any of the memory banks within that repair group. The memory banks 0 and 1 are at the end of the one-dimensional array of memory banks and contain the redundant rows. Memory banks 0 and 1 are also proximal to address matching circuitry 102 which serves to compare an input row address RA addressing that section with predetermined fuse signals identifying defective rows within that section. The address matching circuitry 102 generates a redundant row enable signal (which may comprise multiple individual signals controlling different parts of the behaviour) which is supplied to the memory banks under control of address matching circuitry 102 to direct substitution of a redundant row RR in place of a defective row. There are two types of behaviour which can occur.

When the defective row is in a different memory bank to the memory bank which contains the redundant rows (i.e. for repair group 0, the defective row will be in any of memory banks 2, 4 and 6 whilst the redundant rows RR for that repair group 0 are in memory bank 0), simultaneous access is driven to both the defective row and the redundant row. The defective row will have its word line activated by the standard row address decoder (not illustrated in FIG. 4) and the redundant row will have its word line activated by the address matching circuitry 102. Both the defective row and the redundant row will have their memory cells coupled to the bit lines running through their respective memory banks. The redundant row enable signals from the address matching circuitry 102 serve to suppress reading of the defective row by switching off the sense amplifiers 104 associated with the memory bank (in this illustrated example memory bank 4) containing the defective row. The bit line signals read from the redundant row are used as a replacement and are output from their associated sense amplifiers and be used as the data read from that row address.

The second mode of behaviour is when the defective row is disposed within the memory bank which contains the redundant rows RR for that repair group. In this case the address matching circuitry 102 operates to disable the word line associated with the defective row which has been activated by the normal row address decoder (not illustrated). The redundant row RR which is to be used in place of the defective row will have its word line asserted and accordingly will be read. As will be seen, the address matching circuitry 102 is disposed proximal to the memory banks which contain the redundant rows. This facilitates the rapid disabling of the word line associated with the defective row thereby reducing any problems which might arise due to contention due to two word lines being active within a given memory bank at the same time.

In both the above examples the replacement of the redundant row for the defective row is carried out substantially without adding an extra delay in the normal path which selects a row when it is non-defective. This helps reduce the impact on address time set up performance. The redundant row RR control and replacement is effectively carried out either by a parallel operation in the case of the first scenario discussed above or by a rapid disabling of the defective row facilitated by the nearby address matching circuitry in the second scenario.

Figure 5:
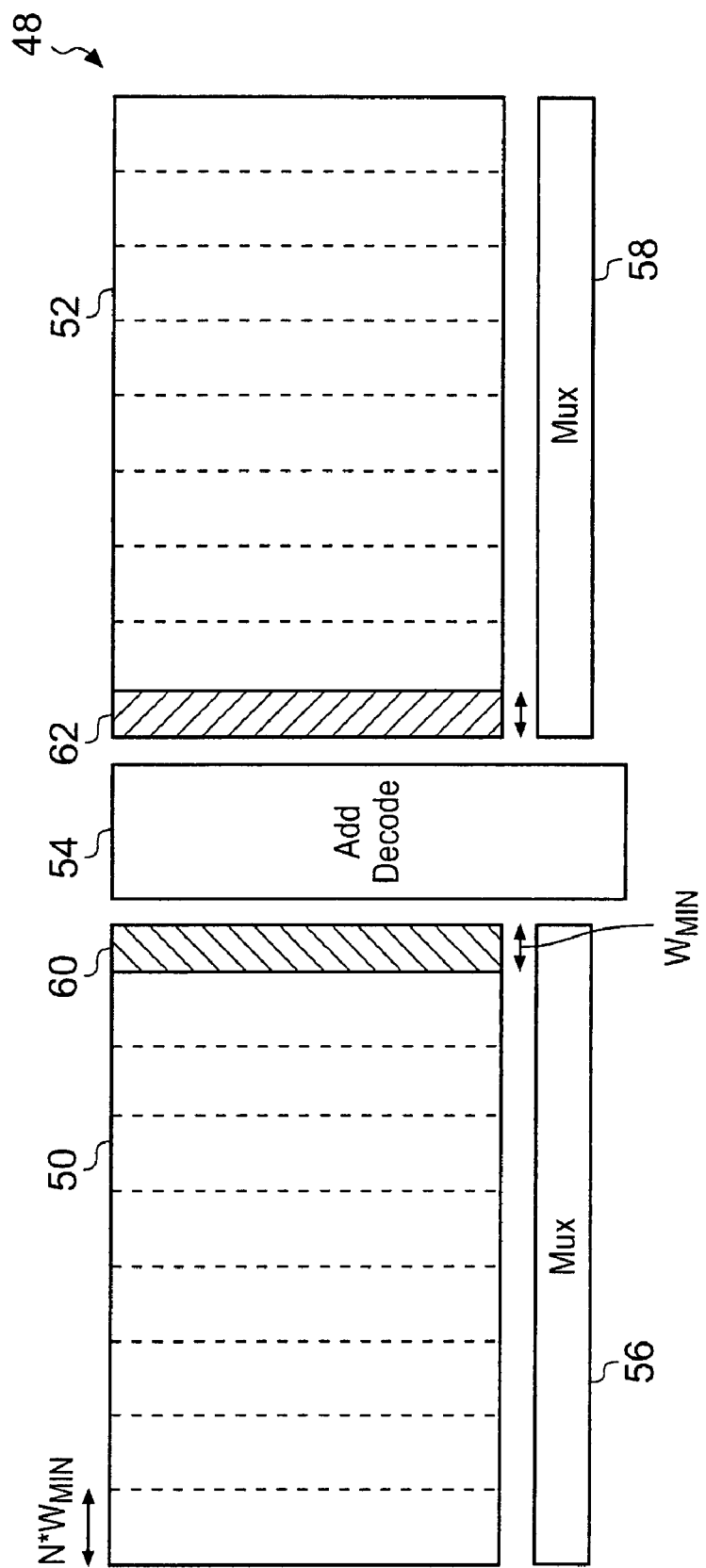
FIG. 5 schematically illustrates a second integrated circuit memory incorporating multiple arrays of memory cells and providing a column redundancy technique.

FIG. 5 schematically illustrates an integrated circuit memory 48 comprising two arrays of memory cells 50, 52 with a shared address decoder 54 disposed therebetween. Multiplexing circuitry 56, 58 associated with each of the arrays 50, 52 serves to select in dependence upon an input address which column of memory cells within a group of memory cells is to be used to provide a particular bit of data to be accessed within an addressed byte/word. This type of multiplexing arrangement whereby columns of memory cells are grouped together and selected between using a multiplexer to provide individual bits is conventional.

The multiplexing circuitry 56, 58 within FIG. 5 is extended beyond the conventional functionality of such multiplexing circuitry 56, 58 by the way in which it serves to select for use redundant columns of memory cells 60, 62 when this is necessary. These redundant columns 60, 62 are provided at one edge of the respective arrays 50, 52. The bit groups which the individual multiplexers select between have a width which is a multiple of powers of two of the minimum width of memory cells (i.e. 8, 16, 32, 64, etc when the minimum width is equal to 8) provided within a unit cell circuit used to form the integrated circuit memory 48. This minimum unit cell width is $W_{min}$. Accordingly, if the minimum unit cell width is eight memory cells wide, then the bit groups of the integrated circuit memory 48 will be 8, 16, 32, etc. in size.

FIG. 6 illustrates the portion of the multiplexing circuitry 56 used to access array 50 for read operations. FIG. 7 illustrates the other portion of the multiplexing circuitry 56 which serves for write operations. Redundant column control circuitry 64 provides control signals to the various multiplexers illustrated in FIGS. 4 and 5 to control their switching state. The signal lines for these control signals have been omitted from FIGS. 6 and 7 for the sake of clarity.

As illustrated in FIG. 6, a defective column of memory cells 66 is found within bit group B3. This is identified during test after production and signaled to the repair control circuitry 64 via a fuse signal. The redundant column control circuitry 64 then serves to generate control signals supplied to the multiplexers illustrated such that the bit groups are selected to have the form shown whereby preceding the defective column 66 the bit groups B0, B1 and B2 are selected in the normal way whereas following the defective column 66 the bit groups are formed so as to be taken half from what would otherwise be one bit group and half from the neighbouring original bit group in a manner shifted towards the redundant columns of memory cells 60. The final bit group is formed from half of bit group B7 and the redundant columns 60. In this way, redundant column substitution is achieved whilst not having to provide a full multiplexer width number of redundant columns 60 as the multiplexing circuitry 56 provides a shift of less than a full multiplexer width.

FIG. 7 illustrates a similar arrangement for the multiplexers used for write operations with the defective row 68 this time being illustrated in a different position, but with the multiplexing circuitry 56 again serving to shift the bit line selection to one side of the defective row 68 by an amount less than the multiplexer width (and equal to the unit cell column width) such that new bit groups are formed and the defective column 68 is substituted by the redundant columns 60.

Figure 8:
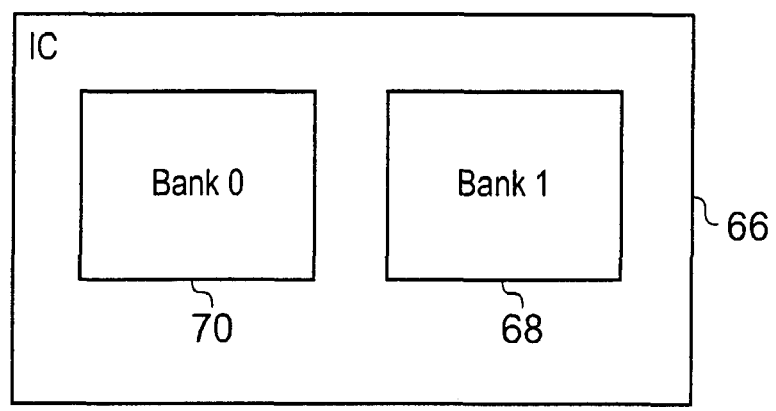
FIG. 8 schematically illustrates an integrated circuit containing multiple memory banks (arrays of memory cells).

FIG. 8 schematically illustrates an integrated circuit 66 comprising multiple memory banks 68, 70. This integrated circuit memory 66 can use a combination of both the redundant row architecture and the redundant column architecture described above. This integrated circuit 66 is illustrated as having only two memory banks 68, 70, but it will be appreciated that many more memory banks may be provided. It will also be appreciated that the integrated circuit memory could provide additional functions other than memory functions and could have onboard processing circuits such as a programmable microprocessor, a DSP engine and the like. The row redundancy and column redundancy techniques described above are applicable for use within integrated circuit memories which form part of larger system-on-chip integrated circuits which are becoming increasingly common.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the appended claims.

We claim:

1. An integrated circuit memory comprising:
   a plurality of memory banks forming a repair group of memory banks, each of said plurality of memory banks having an array of memory cells and a plurality of bit lines coupled to respective columns of memory cells and not shared with any other memory bank; wherein
   at least one of said plurality of memory banks includes at least one redundant row of memory cells and at least one non-redundant row of memory cells; and further comprising:
   redundant row control circuitry coupled to said plurality of memory banks and responsive to input memory address signals addressing a defective row of memory cells within any memory bank within said repair group to substitute one of said at least one redundant rows of memory cells for said defective row of memory cells,
   wherein said redundant row control circuitry comprises address matching circuitry associated with each of said at least one redundant row of memory cells, said address matching circuitry matching an input row address with a predetermined defective row address and generating in dependence thereon a redundant row enable signal to enable a redundant row of memory cells to substitute for a defective row of memory cells having said predetermined defective row address.

2. An integrated circuit memory as claimed in claim 1, comprising a plurality of repair groups, each repair group comprising a plurality of memory banks and including at least one memory bank having at least one redundant row of memory cells and at least one non-redundant row of memory cells.

3. An integrated circuit memory as claimed in claim 1, wherein said repair group contains at least one memory bank not containing any redundant rows of memory cells.

4. An integrated circuit memory as claimed in claim 1, wherein said repair group contains a single memory bank having at least one redundant row of memory cells and at least one non-redundant row of memory cells, other memory banks within said repair group not containing any redundant rows of memory cells.

5. An integrated circuit memory as claimed in claim 1, wherein when said defective row of memory cells is within a different memory bank within said repair group from said redundant row of memory cells, said defective row of memory cells and said redundant row of memory cells are both coupled to bit lines of their respective memory banks during a read operation and said redundant row enable signal selectively disables reading of said defective row memory cells.

6. An integrated circuit memory as claimed in claim 5, wherein said redundant row enable signal selectively disables sense amplifiers responsive to signals upon said bit lines coupled to said defective row of memory cells.

7. An integrated circuit memory as claimed in claim 1, wherein, each of said memory banks includes a plurality of word lines carrying word line signals for controlling access to respective rows of memory cells; and
when said defective row of memory cells and said redundant row of memory cells are within a common memory bank, said redundant row enable signal disables a word line signal of said defective row of memory cells and enables a word line signal of said redundant row of memory cells.

8. An integrated circuit memory as claimed in claim 1, wherein said address matching circuit is proximal to a memory bank containing said associated redundant row of memory cells.

9. An integrated circuit as claimed in claim 1, wherein said predetermined defective row address is generated from plurality of fusible links.

10. An integrated circuit memory comprising:
a plurality of memory banks forming a repair group of memory banks, each of said plurality of memory banks having an array of memory cells and a plurality of bit lines coupled to respective columns of memory cells and not shared with any other memory bank; wherein
at least one of said plurality of memory banks includes at least one redundant row of memory cells and at least one non-redundant row of memory cells; and further comprising:
redundant row control circuitry coupled to said plurality of memory banks and responsive to input memory address signals addressing a defective row of memory cells within any memory bank within said repair group to substitute one of said at least one redundant rows of memory cells for said defective row of memory cells,
wherein each of said memory banks includes a plurality of word lines carrying word line signals for controlling access to respective rows of memory cells,
the integrated circuit memory further comprising an address decoder responsive to an input memory address to generate said word line signals, wherein said redundant row control circuitry is coupled to said address decoder to inhibit generation of a word line signal for said defective row of memory cells and to substitute generation of a word line signal to said redundant row of memory cells.

11. An integrated circuit memory comprising:
a plurality of memory banks forming a repair group of memory banks, each of said plurality of memory banks having an array of memory cells and a plurality of bit lines coupled to respective columns of memory cells and not shared with any other memory bank; wherein:
at least one of said plurality of memory banks includes at least one redundant row of memory cells and at least one non-redundant row of memory cells; and further comprising:
redundant row control circuitry coupled to said plurality of memory banks and responsive to input memory address signals addressing a defective row of memory cells within any memory bank within said repair group to substitute one of said at least one redundant rows of memory cells for said defective row of memory cells, and
adjacent memory banks belong to different repair groups.

12. An integrated circuit memory as claimed in claim 11, wherein said plurality of memory banks comprise two sections of memory banks, each section of memory banks comprising two repair groups.

13. An integrated circuit memory as claimed in claim 12, wherein said plurality of memory banks are disposed as a one-dimension array and those memory banks containing at least one redundant row of memory cells are at a position within their repair group closest to an end of said one-dimensional array.

14. An integrated circuit memory comprising:
a plurality of memory bank means forming a repair group of memory bank means, each of said plurality of memory bank means having an array of memory cell means and a plurality of bit lines coupled to respective columns of memory cell means and not shared with any other memory bank means; wherein
at least one of said plurality of memory bank means includes at least one redundant row of memory cell means and at least one non-redundant row of memory cell means; and further comprising:
redundant row control means coupled to said plurality of memory bank means and responsive to input memory address signals addressing a defective row of memory cell means within any memory bank means within said repair group for substituting one of said at least one redundant rows of memory cell means for said defective row of memory cell means, and
wherein said redundant row control means includes address matching means, associated with each of said at least one redundant row of memory cell means, for matching an input row address with a predetermined defective row address and generating in dependence thereon a redundant row enable signal to enable a redundant row of memory cell means to substitute for a defective row of memory cell means having said predetermined defective row address.

15. A method of operating an integrated circuit memory having
a plurality of memory banks forming a repair group of memory banks, each of said plurality of memory banks having an array of memory cells and a plurality of bit lines coupled to respective columns of memory cells and not shared with any other memory bank, at least one of said plurality of memory banks includes at least one redundant row of memory cells and at least one non-redundant row of memory cells; said method comprising the step of:
in response to input memory address signals addressing a defective row of memory cells within any memory bank within said repair group, substituting one of said at least one redundant rows of memory cells for said defective row of memory cells,
wherein said redundant row control circuitry comprises within said integrated circuit memory address matching circuitry associated with each of said at least one redundant row of memory cells, said address matching circuitry matching an input row address with a predetermined defective row address and generating in dependence thereon redundant row of memory cells enabling signal to enable a redundant row of memory cells to substitute for a defective row of memory cells having said predetermined defective row address.

16. A method as claimed in claim 15, wherein said integrated circuit memory comprises a plurality of repair groups, each repair group comprising a plurality of memory banks and including at least one memory bank having at least one redundant row of memory cells and at least one non-redundant row of memory cells, said step of substituting being performed within each repair group.

17. A method as claimed in claim 15, wherein said repair group contains at least one memory bank not containing any redundant rows of memory cells.

18. A method as claimed in claim 15, wherein said repair group contains a single memory bank having at least one redundant row of memory cells and at least one non-redundant row of memory cells, other memory banks within said repair not containing any redundant rows of memory cells.

19. A method as claimed in claim 15, wherein when said defective row of memory cells is within a different memory bank within said repair group from said redundant row of memory cells, said defective row of memory cells and said redundant row of memory cells are both coupled to bit lines of their respective memory banks during a read operation and said redundant row enable signal selectively disables reading of said defective row memory cells.

20. A method as claimed in claim 19, wherein said redundant row enable signal selectively disables sense amplifiers responsive to signals upon said bit lines coupled to said defective row of memory cells.

21. A method as claimed in claim 19, wherein, each of said memory banks includes a plurality of word lines carrying word line signals for controlling access to respective rows of memory cells; and
when said defective row of memory cells and said redundant row of memory cells are within a common memory bank, said redundant row enable signal disables a word line signal of said defective row of memory cells and enables a word line signal of said redundant row of memory cells.

22. A method as claimed in claim 19, wherein said address matching circuit is proximal to a memory bank containing said associated redundant row of memory cells.

23. A method as claimed in claim 15, wherein said predetermined defective row address is generated from plurality of fusible links.

24. A method of operating an integrated circuit memory having a plurality of memory banks forming a repair group of memory banks, each of said plurality of memory banks having an array of memory cells and a plurality of bit lines coupled to respective columns of memory cells and not shared with any other memory bank, at least one of said plurality of memory banks includes at least one redundant row of memory cells and at least one non-redundant row of memory cells; said method comprising the step of:
in response to input memory address signals addressing a defective row of memory cells within any memory bank within said repair group, substituting one of said at least one redundant rows of memory cells for said defective row of memory cells,
wherein each of said memory banks includes a plurality of word lines carrying word line signals for controlling access to respective rows of memory cells, and
wherein said integrated circuit comprises an address decoder responsive to an input memory address to generate said word line signals and wherein said step of substituting inhibits generation of a word line signal for said defective row of memory cells and substitutes generation of a word line signal to said redundant row of memory cells.

25. A method of operating an integrated circuit memory having a plurality of memory banks forming a repair group of memory banks, each of said plurality of memory banks having an array of memory cells and a plurality of bit lines coupled to respective columns of memory cells and not shared with any other memory bank, at least one of said plurality of memory banks includes at least one redundant row of memory cells and at least one non-redundant row of memory cells; said method comprising the step of:
in response to input memory address signals addressing a defective row of memory cells within any memory bank within said repair group, substituting one of said at least one redundant rows of memory cells for said defective row of memory cells,
wherein adjacent memory banks belong to different repair groups.

26. A method as claimed in claim 25, wherein said plurality of memory banks comprise two sections of memory banks, each section of memory banks comprising two repair groups.

27. A method as claimed in claim 26, wherein said plurality of memory banks are disposed as a one-dimension array and those memory banks containing at least one redundant row of memory cells are at a position within their repair group closest to an end of said one-dimensional array.

* * * * *